United States Patent [19]

Reeser et al.

[11] Patent Number: 5,513,389
[45] Date of Patent: Apr. 30, 1996

[54] PUSH PULL BUFFER WITH NOISE CANCELLING SYMMETRY

[75] Inventors: Glen O. Reeser, Palatine; Lawrence E. Connell, Naperville, both of Ill.

[73] Assignee: Motorola, Inc., Schaumburg, Ill.

[21] Appl. No.: 508,552

[22] Filed: Jul. 28, 1995

Related U.S. Application Data

[63] Continuation of Ser. No. 215,883, Mar. 22, 1994, abandoned, which is a continuation of Ser. No. 936,805, Aug. 27, 1992, abandoned.

[51] Int. Cl.$^6$ ............................................. H04B 1/10
[52] U.S. Cl. ........................ 455/311; 455/341; 455/343; 455/76; 330/268
[58] Field of Search ............................. 455/76, 89, 259, 455/258, 260, 318, 319, 316, 317, 264, 332, 341, 183.1, 255, 310, 295, 296, 311, 343; 330/263, 266, 272, 264, 267, 268, 273, 274, 277; 331/8, 18, 25, 117 R, 117 FE, 177 V, 36 C, 44, 108 A, 108 C, 108 D

[56] References Cited

U.S. PATENT DOCUMENTS

| | | | |
|---|---|---|---|
| 3,432,759 | 3/1969 | Stone | 455/332 |
| 4,031,482 | 6/1977 | Tsurushima | 330/264 |
| 4,335,360 | 6/1982 | Hoover | 330/264 |
| 4,403,198 | 9/1983 | Müller | 330/264 |
| 4,424,493 | 1/1984 | Schroeder | 330/267 |
| 4,433,303 | 2/1984 | Sasaki | 330/264 |
| 4,542,531 | 9/1985 | Fukumura | 455/76 |
| 4,814,723 | 3/1989 | Botti | 330/267 |
| 4,939,790 | 7/1990 | Sgrignoli | 455/260 |
| 5,107,228 | 4/1992 | Pham et al. | 331/117 R |
| 5,140,286 | 8/1992 | Black et al. | 455/76 |
| 5,218,325 | 6/1993 | Trelewecz et al. | 455/260 |
| 5,230,088 | 7/1993 | Kramer, Jr. et al. | 455/260 |

Primary Examiner—Reinhard J. Eisenzopf
Assistant Examiner—Nguyen Vo
Attorney, Agent, or Firm—Gary J. Cunningham

[57] ABSTRACT

A buffer (200) having output devices (101 and 102) exhibiting complementary symmetry and configured as voltage-followers in push pull is biased for class AB operation by a bias network including two substantially equal resistors (201 and 202) arranged and configured to substantially reduce noise attributable to the bias circuit.

6 Claims, 1 Drawing Sheet

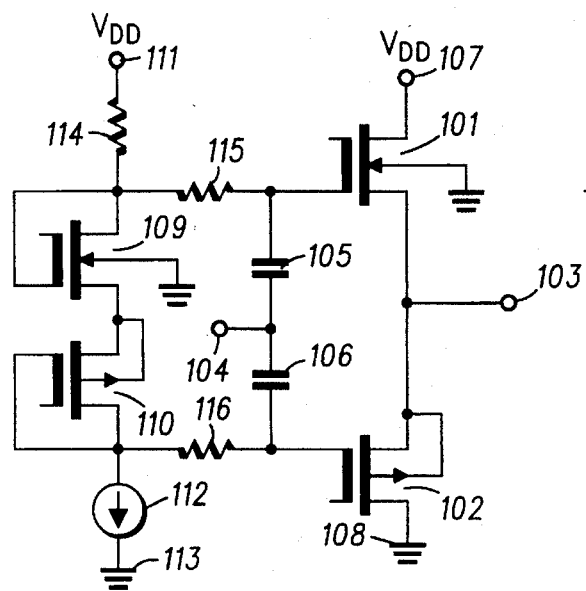
FIG.1 *100* — PRIOR ART —
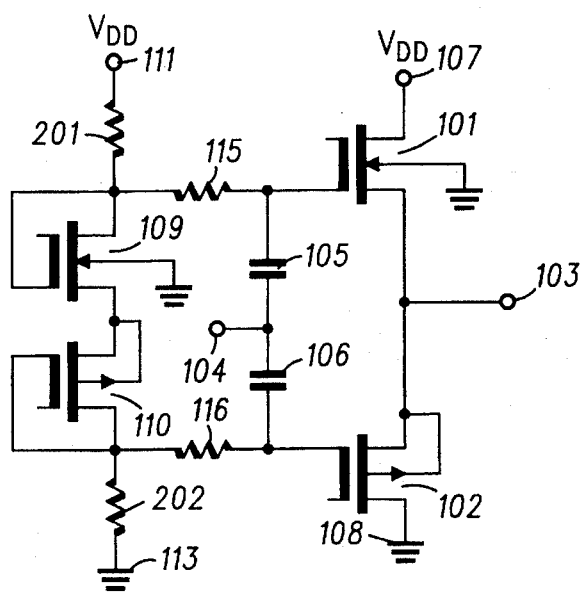
FIG.2 *200*
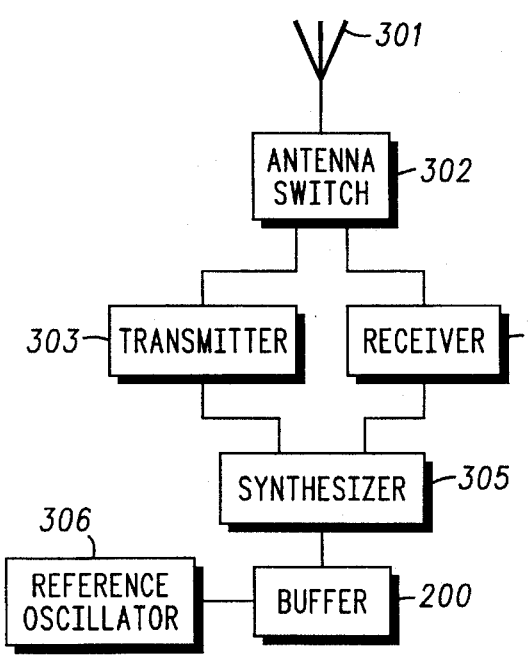
FIG.3 *300*

PUSH PULL BUFFER WITH NOISE CANCELLING SYMMETRY

This is a continuation of application Ser. No. 08/215,883, filed Mar. 22, 1994, now abandoned, which is a continuation of application Ser. No. 07/936,805, file Aug. 27, 1992, now abandoned.

FIELD OF THE INVENTION

This invention relates generally to amplifiers and in particular to push pull buffer amplifiers, and is more particularly directed toward a push pull buffer with a symmetrical bias network and symmetrical output device geometry designed to cancel internally generated noise voltages.

BACKGROUND OF THE INVENTION

Modern RF (radio frequency) communication units, such as cellular telephones and conventional and trunked RF transceivers, generally employ frequency synthesizers rather than depending upon well-known crystal control technology. With a frequency synthesizer, reconfiguring a communication unit for operation on a new frequency is a simple matter of reprogramming, whereas, with crystal control, a new pair of crystals is generally needed.

In cellular telephone communication systems, it would simply be impracticable to provide a communication unit with the enormous set of crystals required to cover a cellular system's 866 possible operating frequencies. Even trunked communication systems often employ a large number of possible operating frequencies. Furthermore, users of conventional RF transceivers have come to view synthesized communication units as desirable, since the ability to reprogram operating frequencies makes it easy to move communication units from system to system.

As is well known, a frequency synthesizer system is only as good as its reference oscillator. A synthesizer's accuracy and stability is directly traceable to the accuracy and stability of the reference. Much work has been done to improve reference oscillator design, to the point where excellent accuracy and stability over temperature have been achieved.

Even after a reference oscillator design has been perfected, however, the reference output must be buffered and distributed to various subsystems within a communication unit. For small, battery powered communication units, such as portable cellular phones, at least two important design considerations immediately surface. First, the reference oscillator and associated buffering and signal distribution circuitry must use minimal power in order to conserve battery life. Second, the distributed reference oscillator signal must have excellent spectral purity to minimize spurious signals and attendant denigration of system operation.

Reference signal buffer amplifiers are generally biased for class AB operation in order to limit output stage power consumption. Furthermore, since space is often at a premium in hand-held communication units, most subassemblies, including reference oscillators and associated output buffers, are implemented using integrated circuit (IC) or hybrid designs. This need to conserve space dictates that transistor geometries, particularly in low current applications such as bias networks, be kept as small as possible.

Unfortunately, the small geometry and low operating current of transistors used in bias networks yield poor noise characteristics that degrade overall amplifier noise figure.

Accordingly, a need arises for a buffer stage that will exhibit good noise performance despite size and power constraints.

SUMMARY OF THE INVENTION

This need and others are satisfied by the buffer amplifier of the present invention, which comprises a class AB amplifier circuit having a bias circuit operably coupled thereto, wherein the bias circuit includes two substantially equal resistors arranged and configured to substantially reduce noise attributable to the bias circuit.

BRIEF DESCRIPTION OF THE DRAWINGS

FIG. 1 is a schematic diagram of a buffer stage of the prior art;

FIG. 2 is a schematic diagram of a buffer stage constructed in accordance with the present invention; and FIG. 3 depicts, in block diagram form, an RF transceiver.

DESCRIPTION OF A PREFERRED EMBODIMENT

FIG. 1 illustrates an output buffer amplifier of the prior art, generally depicted by the numeral 100. A pair of output transistors (101 and 102) are connected together as voltage followers in push pull configuration, with an output (103) provided between the two devices (101 and 102). An input (104) is AC (alternating current) coupled to the output devices (101 and 102) through coupling capacitors (105 and 106). The output transistors (101 and 102) are connected to a supply voltage (107) at one end, and to ground (108) at the other.

The output devices (101 and 102) are enhancement mode MOSFETs (metal-oxide-semiconductor field effect transistors) displaying complementary symmetry. That is, one device (101) is n-type and the other (102) is p-type. In push pull configuration, the transistors (101 and 102) are biased for class AB operation; that is, neither output device conducts for a full cycle of the amplifier's sinusoidal input signal, but each device conducts for more than one-half cycle. This configuration is generally selected to limit power consumption. To minimize distortion while conserving power, each device is generally biased close to its cut-in voltage (the point where the device begins to conduct) in order to eliminate crossover distortion.

In order to provide the appropriate bias voltages to the output devices (101 and 102), a pair of diode-connected, complementary transistors (109 and 110) are series-connected as part of a bias network. The transistors used to provide bias (bias transistors) (109 and 110) are connected to supply voltage (111) at one end, through a series resistor (114), and to a current source (112) at the other. The current source is then coupled to ground (113). This collection of components, including the bias transistors (109 and 110), the series resistor (114) and the current source (112), along with two resistors (115 and 116) that couple bias voltages to the output devices (101 and 102), may be termed a bias network.

A bias network of the type just described performs adequately in terms of providing proper bias voltages to the output devices over a relatively wide temperature range. Unfortunately, the geometry of the bias transistors (109 and 110) is deliberately kept small to conserve valuable IC real estate, and the current level provided by the current source (112) is kept small to conserve power. Under these operating conditions, excessive noise voltages generated within the bias network are transferred to the output devices (101 and 102). It is for just such a problem that the buffer of the present invention offers relief.

The excessive noise voltages just described are due in part to thermal noise within the bias transistors (109 and 110), and in part to flicker noise traceable to trapped charges in the oxides formed during IC construction. In fact, flicker noise is even more pronounced in devices of small geometry.

The circuit of FIG. 2 is a push pull buffer constructed in accordance with the present invention and generally depicted by the numeral 200. Although MOSFET devices are depicted, the invention is equally applicable to circuitry constructed using bipolar transistors. The output devices shown in FIG. 2 (101 and 102) are configured and biased for class AB operation, similar to the configuration of FIG. 1. In fact, much of the circuit of FIG. 2 functions in the same way described in conjunction with FIG. 1, so further description will be limited for the sake of brevity.

The bias networks of FIGS. 1 and 2 differ in order to overcome the excessive noise generation phenomenon associated with bias networks of the prior art. In the circuit of FIG. 2, in addition to two diode-connected transistors (109 and 110) in the bias network, there are two closely matched (equal in value) resistors (201 and 202) connected in series with the bias transistors (109 and 110). Generally, resistance values greater than about 10K (kilohms) would be appropriate in this application. In the preferred embodiment, resistors having a value of 25K are used. One of the resistors (201) couples the bias transistors (109 and 110) to supply voltage, while the other resistor (202) couples the bias transistors (109 and 110) to ground (113). Resultant bias voltages are coupled to the output devices (101 and 102) through coupling resistors (115 and 116).

Since symmetry is maintained throughout, not only in the bias network, but in the output stage as well, noise voltages generated in the bias network are cancelled at the output. The matched bias resistors (201 and 202) present equal impedances at the top and bottom of the bias network, so that noise voltages generated in between the two resistors (i.e., within the bias transistors) couple in equal but opposite senses to the amplifier transistors (101 and 102). Since the output devices (101 and 102) are complementary and have similar transconductances, the noise voltages will have no effect on the signal output (103). Qualitatively, one can categorize the balanced, unwanted noise voltages as fully differential mode signals that have been rejected by a common mode only amplifier.

As mentioned previously, precision reference oscillators and their associated low-noise buffer amplifiers find widespread application in RF communication equipment, with low-current oscillator and buffer implementations being especially well-suited to portable applications. FIG. 3 depicts, in block diagram form, an RF communication unit generally depicted by the numeral 300.

The RF communication unit (300) includes an antenna (301) for transmission and reception of RF signals. The antenna generally couples to an antenna switch (302) that switches the signal path between a transmitter (303) and a receiver (304), well known in the art. Of course, for full-duplex communication, the antenna switch (302) would be replaced by a directional coupler. Of course, if the communication unit (300) were designed for receiving RF signals only, as is a radio pager, neither the antenna switch (302) nor the transmitter portion (303) would be required.

Modern communication units generally employ a well-known frequency synthesizer (305) to control operating frequency. It is even possible, in some applications, for separate synthesizers to be used for transmitter and receiver. In either case, a frequency synthesizer requires a reference oscillator (306), for which designs are well-developed in the pertinent art, to provide an accurate, temperature-independent reference signal for maximum frequency accuracy and stability.

In conjunction with the reference oscillator (306), a buffer (200) such as the one depicted in FIG. 2 is used to ensure that a sinusoidal reference signal with minimal harmonic content and with a level output over variations in temperature is distributed to the synthesizer (305), as well as to any other subsystems (not shown) that may require an accurate, stable reference signal of relatively high spectral purity.

What is claimed is:

1. An apparatus comprising:

a class AB amplifier circuit;

a bias circuit operably coupled to the class AB amplifier circuit, wherein the bias circuit contains exactly two substantially equal resistors arranged and configured to substantially reduce noise attributable to the bias circuit, wherein the bias circuit includes two active elements coupled between a voltage source and ground, with the substantially equal resistors configured in series with the two active elements, and wherein a first one of the two substantially equal resistors couples the two active elements to the voltage source, and a second one of the two substantially equal resistors couples the two active elements to ground, wherein the bias circuit does not include any other circuit elements in parallel with the two substantially equal resistors that would preclude noise attributable to the bias circuit from being substantially reduced, and wherein the noise is due in part to thermal noise and in part to flicker noise.

2. The apparatus of claim 1, wherein both of the two active elements are diode-connected transistors.

3. The apparatus of claim 2, wherein the transistors are MOSFETs.

4. The apparatus of claim 2, wherein each of the substantially equal resistors has a resistance greater than 10K.

5. The apparatus of claim 2, wherein each of the substantially equal resistors has a resistance substantially equal to 25K.

6. A push pull buffer comprising:

an output stage including:
a pair of complementary MOSFETs configured as voltage followers and connected together in push pull with an output between the pair;

a bias network including:
a pair of diode-connected complementary MOSFETs arranged in series;
a pair of matched resistors forming a first matched resistor and a second matched resistor, with the first matched resistor coupling one side of the pair of diode-connected MOSFETs to a voltage source, and the second matched resistor coupling the other side of the pair of diode-connected MOSFETs to a ground;

a pair of coupling resistors operably interconnecting the bias network and the output stage to bias the complementary MOSFETs of the output stage for class AB operation;

such that noise voltages generated between the pair of matched resistors are substantially equally divided between the complementary MOSFETs of the output stage, resulting in essentially no net change in voltage at the output, wherein the bias circuit does not include any other circuit elements in parallel with the matched resistors that would preclude the noise voltages from being substantially equally divided between the complementary MOSFETs of the output stage resulting in essentially no net change in voltage at the output, and wherein the noise voltages are due in part to thermal noise, and in part to flicker noise.

* * * * *